US012584247B1

(12) United States Patent
Agarwal et al.

(10) Patent No.: US 12,584,247 B1
(45) Date of Patent: *Mar. 24, 2026

(54) POLYMER NANOCOMPOSITE FLEXIBLE FILMS FOR ELECTROMAGNETIC INTERFERENCE SHIELDING

(71) Applicants: Arvind Agarwal, Miami, FL (US); Markondeyaraj Pulugurtha, Miami, FL (US); Lihua Lou, Miami, FL (US); Ghaleb Saleh Ghaleb Al-Duhni, Miami, FL (US)

(72) Inventors: Arvind Agarwal, Miami, FL (US); Markondeyaraj Pulugurtha, Miami, FL (US); Lihua Lou, Miami, FL (US); Ghaleb Saleh Ghaleb Al-Duhni, Miami, FL (US)

(73) Assignee: The Florida International University Board of Trustees, Miami, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/324,984

(22) Filed: Sep. 10, 2025

Related U.S. Application Data

(63) Continuation of application No. 19/048,359, filed on Feb. 7, 2025, now Pat. No. 12,416,104.

(51) Int. Cl.
| | |
|---|---|
| *D01D 11/06* | (2006.01) |
| *D01D 1/02* | (2006.01) |
| *D01D 1/06* | (2006.01) |
| *H05K 9/00* | (2006.01) |

(52) U.S. Cl.
CPC ............... *D01D 11/06* (2013.01); *D01D 1/02* (2013.01); *D01D 1/065* (2013.01); *H05K 9/009* (2013.01); *H05K 9/0092* (2013.01); *D10B 2321/10* (2013.01); *D10B 2401/16* (2013.01); *D10B 2403/0243* (2013.01)

(58) Field of Classification Search
None
See application file for complete search history.

(56) References Cited

U.S. PATENT DOCUMENTS

| | | | |
|---|---|---|---|
| 2014/0093731 A1 | 4/2014 | Bonfiglio et al. | |
| 2017/0103826 A1* | 4/2017 | Al-Harthi | H01B 3/004 |
| 2020/0098997 A1* | 3/2020 | Watabe | H10K 85/654 |
| 2020/0407627 A1* | 12/2020 | Zhou | C09K 11/883 |
| 2023/0019695 A1* | 1/2023 | Kandhasamy | C09D 7/65 |

* cited by examiner

*Primary Examiner* — Samir Shah
(74) *Attorney, Agent, or Firm* — SALIWANCHIK, LLOYD & EISENSCHENK

(57) ABSTRACT
Materials are provided that can be used for electromagnetic interference (EMI) shielding, and methods of fabricating the same and methods of using the same are also provided. Polymer-based fiber thin films can have superior electrical conductivity and excellent EMI shielding efficiency while being ultra-flexible and ultra-lightweight. The fiber thin films can be dual polymer thin films and can incorporate quantum dots (QDs) (e.g., magnetic quantum dots) and/or two-dimensional (2D) conductive nanomaterials within a dual polymer matrix comprising a conductive polymer and a nonconductive polymer. The resultant composite thin film can have low density, high porosity, and high electrical conductivity.

4 Claims, 14 Drawing Sheets

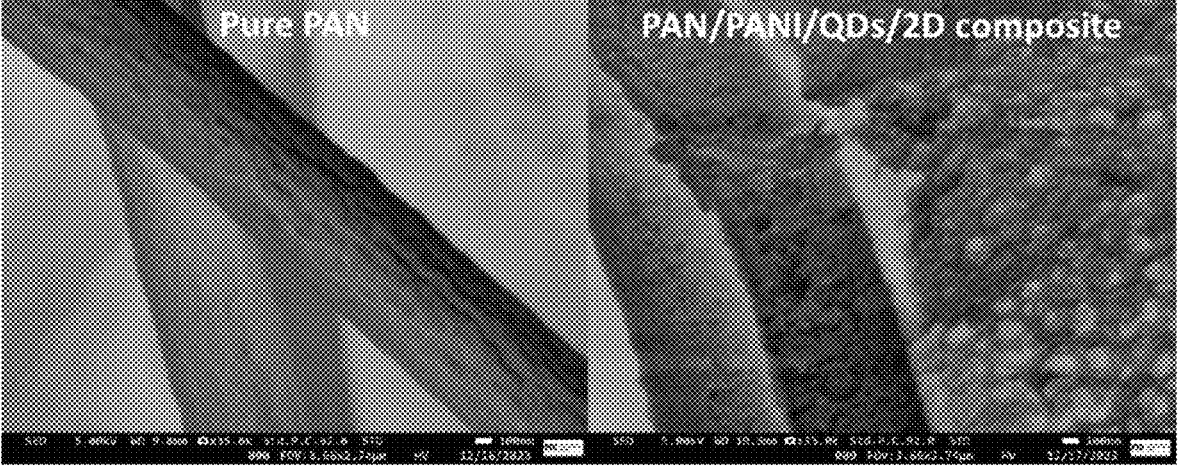
FIG. 2A                                        FIG. 2B

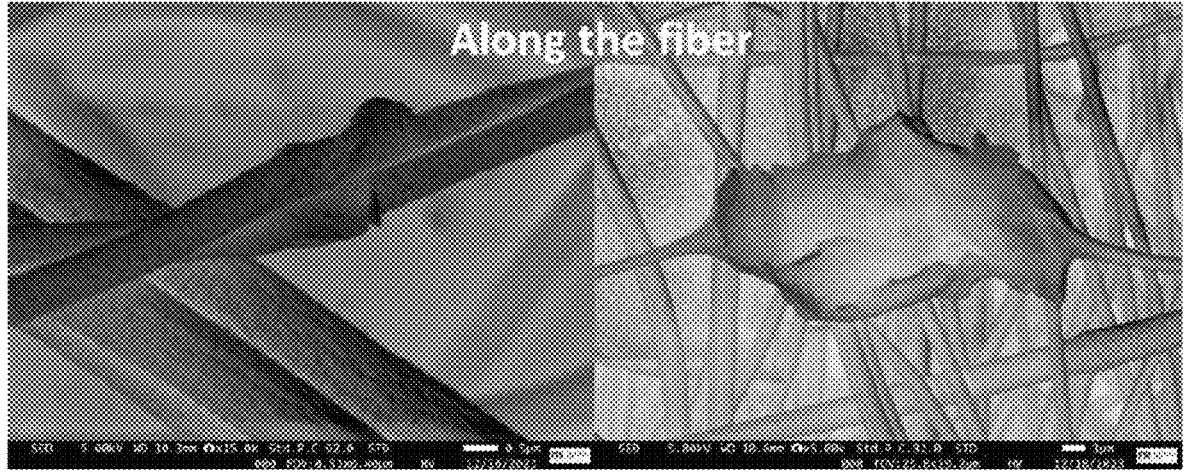
FIG. 3A                    FIG. 3B

FIG. 8A                                    FIG. 8B

| | Materials | Max. conductive material % | Manufacturing | Thickness | Density | Max. electrical conductivity | EM wavelength | Max. EM shielding effectiveness |
|---|---|---|---|---|---|---|---|---|
| Embodiment of the subject invention | 0D/2D nanomaterials integrated dual polymer nanofiber thin films | 25 wt % | | 50 μm | 1 - 1.2 g/cm³ | 600,000 S/m | 0 - 1 MHz | 54 dB |
| | | | | | | | 0.15 - 12 GHz | 70 - 101 dB |
| | | | | | | | 8 - 12 GHz | 180 dB |
| Mechanically and environmentally robust composite nanofibers with embedded MXene for wearable shielding of electromagnetic wave | Poly (vinylidene fluoride-co-hexafluoropropylene) (PVDF-HFP) composite fabric with MXene embedded in nanofibers | 82 wt.% | | 125 μm | / | / | 8-12 GHz | 160 dB |
| Method 2 US8351220B2 | At least two electrically conductive nanoscale fiber films overlying and spaced apart from one another | 50 wt % | Stacking | 1 - 2.5 mm | 18.1 - 21.5 g/m² | 60,000 S/m | 1 - 18 GHz | 100 dB |
| Method 2 US7592389B2 | Graphitic nanofiber-based composites | Graphite 15 wt.% | Electrospinning and conventional plastics processing techniques | 1 mm | / | 3,800,000 Ω·cm | / | / |
| Method 2 US20080195186A1 | Metal Pt, Pd, Ti, Ag, Au, MP35N and their alloys Carbon, carbon fiber, carbon nanofiber, and single or multi-walled carbon nanotube | / | Wrapped or woven | / | / | / | / | / |
| Method 2 Electrospun ZrC@ carbon nanofiber mats and their epoxy composites as effective EMI shields in Ku band | ZrC@CNF/epoxy composites | ZrO2 50% | Electrospinning, carbonization, and epoxy resin composite fabrication | 0.72 mm with 8 layers | / | 0.011 Ω·cm | 12-18 GHz | 90 dB |

FIG. 11A

| | | | | | | | | |
|---|---|---|---|---|---|---|---|---|
| Method 1 US20100311866A1 | nickel-coated carbon fibers, carbon and multi-walled carbon nanotubes mixed within an ABS copolymer matrix | / | Electrospinning and compression molding | / | / | / | / | / |
| *Method 2* US1040037082 | (copper and nickel)-plated carbon fiber-based nonwoven fabric | Metal-plated carbon fiber 30 wt% | *Electroless or electrolesis continuous process* | 0.35 – 51 mm | 2.7 g/cm³ | 3.5 × 10⁻⁵ Ω·cm | 1 GHz | 95 dB |
| *Method 3* Lightweight and flexible electrospun polymer nanofiber/metal nanoparticle hybrid membrane for high-performance electromagnetic interference shielding | Crosslinking polyacrylonitrile (CPAN) nanofiber (NF)/metal nanoparticle (MNP) hybrid membranes | / | *Electrospinning, carbonization, chemical seeding, and electroless deposition* | 53 μm | 1.17 – 2.12 g/cm³ | 640,000 S/m | 8–26 GHz | 90 dB |
| *Method 3* Ultrathin flexible electrospun EVA nanofiber composite with electrothermally-driven shape memory effect for electromagnetic interference shielding | EVA@PDA@Ag | / | Electrospinning and *chemical deposition* | 40 μm | / | 250,000 S/m | 3.94–5.99 GHz | 87 dB |
| *Method 3* Lightweight, flexible and superhydrophobic composite nanofiber films inspired by nacre for highly electromagnetic interference shielding | PAN@SiO2-Ag composite nanofiber films finishing with a PTDF agent | / | *Electrospinning, chemical deposition, and surface treatment* | 40 μm | 0.22 g/cm³ | 17,784 S/m | 8–12 GHz | 82 dB |
| *Method 3* Superhydrophobic and corrosion-resistant electrospun hybrid membrane for high-efficiency electromagnetic interference shielding | APAN-Ag-SA-T | / | *Electrospinning, alkali etching, and chemical deposition* | 38 μm | 2.04 g/cm³ | 3,731,900 S/m | 8–26.5 GHz | 90.14 dB |
| *Method 3* Flexible and ultrathin waterproof cellular membranes based on high-conjuction metal-wrapped polymer nanofibers for electromagnetic interference shielding | polydopamine-assisted metal (copper or silver) deposition on electrospun polymer nanofibers | / | Electrospinning and *electroless depositing* | 2.3 μm | 1.6 g/cm³ | 767,000 S/m | 8–12 GHz | 53 dB |

FIG. 11B

| Method 4<br>CN113809439B | MXene/silver nanowire and aramid nanofiber | MXene/Ag of 80 wt% | *Vacuum-assisted suction filtration* | / | / | 372,560 S/m | 8.4 – 12.4 GHz | 79.8 dB |
|---|---|---|---|---|---|---|---|---|
| Method 4<br>Controlled Distributed Ti3C2Tx Hollow Microspheres on Thermally Conductive Polyimide Composite Film for Excellent Electromagnetic Interference Shielding | (Fe3O4/PI)–Ti3C2Tx–(Fe3O4/PI) composite | / | *Electrospinning, vacuum-assisted filtration, lamination hot pressing, and thermal treatment* | 75 μm | / | / | 8-12 GHz | 85 dB |
| CN110540729B | Polymer/silver foam | Silver 30 – 50 % | by template sacrifice method, in-situ growth | 3 mm | 0.1 – 0.16 g/cm | 700 S/m | 8.2 – 12.5 GHz | 90 dB |

FIG. 11C

POLYMER NANOCOMPOSITE FLEXIBLE FILMS FOR ELECTROMAGNETIC INTERFERENCE SHIELDING

CROSS-REFERENCE TO RELATED APPLICATION

The present application is a continuation application of U.S. application Ser. No. 19/048,359, filed Feb. 7, 2025, the disclosure of which is hereby incorporated by reference in its entirety, including all figures, tables, and drawings.

BACKGROUND

Advanced electronic devices, including portable, wearable, and flexible gadgets, operate within intricate electromagnetic environments. These environments are susceptible to electromagnetic interference (EMI) originating from internal electronic components and external printed circuits. EMI shielding is used to reduce the inductive and capacitive couplings between components, thus reducing data loss during wireless communication and diminished sensitivity/efficiency. Additionally, EMI can adversely affect human health, impacting the nervous system and causing visual impairments. EMI shielding materials are essential to comply with the electromagnetic compatibility (EMC) regulation, and a shielding effectiveness of at least 30 decibels (dB) is required to comply. However, achieving shielding of 30 dB against magnetic field sources is challenging due to the impedances of low magnetic field sources.

Metals have outstanding electrical conductivity and are commonly used as EMI shielding materials. The principal mechanism of EMI shielding in metals is reflection, but this reflection of EMI waves can lead to second order electromagnetic pollution. Further, metals possess several limitations, including high density, limited mechanical flexibility, susceptibility to corrosion, and a constrained absorption bandwidth. Most importantly, EMI shields made from metals are effective at low frequencies but less so at high frequencies due to reduced magnetic permeability. Copper and aluminum, while applicable across frequency ranges, necessitate increased thickness for adequate shielding. These characteristics render metals less suitable for modern electronic devices that demand ultra-lightweight construction, extreme flexibility, and durability against repeated folding.

In order to attempt to address the challenges for metals, metal coatings have been employed. However, this approach encounters several technical difficulties. These include the metal layer's inadequate adhesion (poor binding) to the substrate, challenges in achieving uniform coating thickness, and reduced EMI shielding effectiveness. The latter issue is particularly pronounced due to the propensity of the metal coating to crack under conditions of repeated bending and elongation, which compromises its shielding capabilities.

BRIEF SUMMARY

Embodiments of the subject invention provide novel and advantageous materials that can be used for electromagnetic interference (EMI) shielding, as well as methods of fabricating the same and methods of using the same. Polymer-based fiber thin films of embodiments can have superior electrical conductivity and excellent EMI shielding efficiency while being ultra-flexible and ultra-lightweight. The fiber thin films can be dual polymer thin films and can incorporate quantum dots (QDs) (e.g., magnetic quantum dots) and/or two-dimensional (2D) conductive nanomaterials within a dual polymer matrix comprising a conductive polymer and a nonconductive polymer. The resultant composite thin film can have low density, high porosity, and high electrical conductivity.

In an embodiment, a polymer-based thin film can comprise: a multilayer fiber matrix comprising a first polymer and a second polymer different from the first polymer; and nanomaterials incorporated within the multilayer fiber matrix. The nanomaterials can comprise QDs (e.g., magnetic QDs, such as iron oxide QDs), 2D conducive nanomaterials (e.g., graphene nanoplatelets (GNP)), or both. The polymer-based thin film can have a thickness of, for example, no more than 500 micrometers ($\mu m$) (e.g., no more than 100 $\mu m$, no more than 50 $\mu m$, or about 50 $\mu m$). The first polymer can be a nonconductive polymer and the second polymer can be a conductive polymer. The polymer-based thin film can have an electrical conductivity of, for example, at least 40,000 Siemens per meter (S/m) (e.g., at least 300,000 S/m, or in a range of from 40,000 S/m to 600,000 S/m). The polymer-based thin film can have a density of, for example, no more than 2 grams per cubic centimeter ($g/cm^3$) (e.g., in a range of from 1 $g/cm^3$ to 1.2 $g/cm^3$). The polymer-based thin film can have a porosity of, for example, at least 60% (e.g., in a range of from 60% to 80%). The polymer-based thin film can be configured to be completely folded at least 1,000 times without any breakage of the film. The QDs can be present in the polymer-based thin film in an amount of, for example, no more than 1 wt. %. The 2D conducive nanomaterials can be present in the polymer-based thin film in an amount of, for example, no more than 25 wt. %. The nanomaterials can be incorporated along a radial axis of fibers of the multilayer fiber matrix, and/or the nanomaterials can be incorporated by being interspersed between layers of the multilayer fiber matrix. The polymer-based thin film can further comprise a doping acid (e.g., camphorsulfonic acid (HCSA)). The first polymer can be, for example, polyacrylonitrile (PAN), poly(vinylidene fluoride) (PVDF), polystyrene (PS), polypropylene (PP), or polytetrafluoroethylene (PTFE). The second polymer can be, for example, polyaniline (PANI).

In another embodiment, an EMI shield can comprise: a substrate; and a polymer-based thin film (as disclosed herein) disposed on the substrate. The polymer-based thin film can have any or all of the features discussed in the previous paragraph. The EMI shield can have an EMI shielding effectiveness of at least 30 decibels (dB) (e.g., at least 40 dB or at least 50 dB) at any or all frequencies in a range of from 1 kilohertz (kHz) to 12 gigahertz (GHz) (or any subrange therewithin, such as from 1 kHz to 1 MHz or from 1 kHz to 1 GHZ), and/or an EMI shielding effectiveness of at least 100 dB (e.g., at least 160 dB or at least 170 dB) at any or all frequencies in a range of from 8 GHz to 12 GHz (or any subrange therewithin). The substrate can lack EMI shielding properties (e.g., a (thin) paper substrate) (e.g., the substrate can have an EMI shielding effectiveness of less than 5 dB (such as less than 1 dB or less than 0.5 dB) at all frequencies in a range of from 1 kHz to 12 GHZ (or any subrange therewithin)).

In another embodiment, a method of fabricating a polymer-based thin film can comprise: preparing an electrospinning solution comprising a first polymer, a second polymer different from the first polymer, and nanomaterials; and performing an electrospinning process using the electrospinning solution to form the polymer-based thin film on a substrate. The nanomaterials can comprise QDs (e.g., magnetic QDs, such as iron oxide QDs), 2D conducive nano-materials (e.g., GNP), or both. The polymer-based thin film can have a thickness of, for example, no more than 500 μm (e.g., no more than 100 μm, no more than 50 μm, or about 50 μm). The first polymer can be a nonconductive polymer and the second polymer can be a conductive polymer. The polymer-based thin film can have any or all of the features discussed in the previous two paragraphs, including the EMI shielding properties. The polymer-based thin film can have an electrical conductivity of, for example, at least 40,000 S/m (e.g., at least 300,000 S/m, or in a range of from 40,000 S/m to 600,000 S/m). The polymer-based thin film can have a density of, for example, no more than 2 g/cm$^3$ (e.g., in a range of from 1 g/cm$^3$ to 1.2 g/cm$^3$). The polymer-based thin film can have a porosity of, for example, at least 60% (e.g., in a range of from 60% to 80%). The polymer-based thin film can be configured to be completely folded at least 1,000 times without any breakage of the film. The QDs can be present in the polymer-based thin film in an amount of, for example, no more than 1 wt. %. The 2D conducive nano-materials can be present in the polymer-based thin film in an amount of, for example, no more than 25 wt. %. The nanomaterials can be incorporated along a radial axis of fibers of the multilayer fiber matrix, and/or the nanomate-rials can be incorporated by being interspersed between layers of the multilayer fiber matrix. The polymer-based thin film can further comprise a doping acid (e.g., HCSA). The first polymer can be, for example, PAN, PVDF, PS, or PTFE. The second polymer can be, for example, PANI. The pre-paring of the electrospinning solution can comprise: forming a homogeneous solution by dissolving the first polymer in an organic solvent; adding the second polymer to the homoge-neous solution to give a first intermediate solution; perform-ing magnetic dispersion on the first intermediate solution; after performing magnetic dispersion on the first intermedi-ate solution, adding a doping acid to the first intermediate solution to give a second intermediate solution; performing magnetic dispersion on the second intermediate solution; after performing magnetic dispersion on the second inter-mediate solution, adding a first portion of the nanomaterials (e.g., the 2D conductive nanomaterials) to the second inter-mediate solution to give a third intermediate solution; per-forming magnetic dispersion and ultrasonication on the third intermediate solution; after performing magnetic dispersion on the third intermediate solution, adding a second portion of the nanomaterials (e.g., the QDs) to the third intermediate solution to give a fourth intermediate solution; and perform-ing magnetic dispersion and ultrasonication on the fourth intermediate solution to give the electrospinning solution. The electrospinning solution can then remain under continu-ous magnetic dispersion until the electrospinning process is started. Each magnetic dispersion step and each ultrasoni-cation step can be performed for a predetermined amount of time (e.g., in a range of from 0.5 hours to 48 hours or more).

BRIEF DESCRIPTION OF DRAWINGS

FIG. 2A shows a scanning electron microscope (SEM) image of pure PAN. The scale bar is 100 nanometers (nm).

FIG. 2B shows an SEM image of a PAN/PANI/QDs/2D fiber composite. The scale bar is 100 nm.

FIG. 3A shows an SEM image of QDs and 2D nanoma-terials incorporated along the fiber within a multilayer fiber matrix. The scale bar is 0.5 micrometers (μm).

FIG. 3B shows an SEM image of QDs and 2D nanoma-terials incorporated along the fiber within a multilayer fiber matrix. The scale bar is 1 μm.

the curve with the third-lowest shielding effectiveness value at a frequency of 275 MHz is for measured PAN-3GNP-20PANI-20HCSA; the curve with the second-lowest shielding effectiveness value at a frequency of 275 MHz is for simulated PAN-1.5GNP-20PANI-20HCSA; and the curve with the lowest shielding effectiveness value at a frequency of 300 MHz is for measured PAN-1.5GNP-20PANI-20HCSA.

Figure 8:
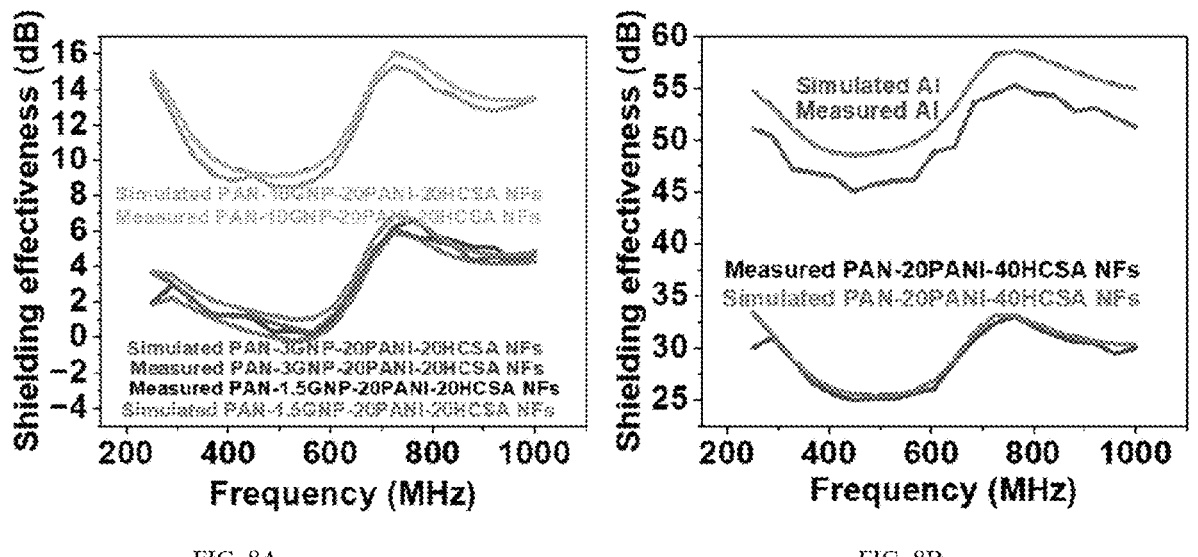
FIG. 8A shows a plot of measured and simulated shielding effectiveness (in dB) versus frequency (in MHz) for a PAN-10GNP-20PANI-20HCSA fiber thin film, a PAN-3GNP-20PANI-20HCSA fiber thin film, and a PAN-1.5GNP-20PANI-20HCSA fiber thin film. In the naming of these films, the number before each component represents the weight percentage of that component, with PAN being the balance of the material. For example, PAN-10GNP-20PANI-20HCSA means 10 wt. % GNP, 20 wt. % PANI, 20 wt. % HCSA, and the balance of PAN (i.e., 50 wt. % PAN). The curve with the highest shielding effectiveness value at a frequency of 300 MHz is for simulated PAN-10GNP-20PANI-20HCSA; the curve with the second-highest shield-ing effectiveness value at a frequency of 300 MHz is for measured PAN-10GNP-20PANI-20HCSA; the curve with the third-highest shielding effectiveness value at a frequency of 300 MHz is for simulated PAN-3GNP-20PANI-20HCSA.

FIG. 8B shows a plot of measured and simulated shielding effectiveness (in dB) versus frequency (in MHz) for a PAN-20PANI-40HCSA fiber thin film and an aluminum film. The curve with the highest shielding effectiveness value at a frequency of 300 MHz is for simulated aluminum; the curve with the second-highest shielding effectiveness value at a frequency of 300 MHz is for measured aluminum; the curve with the second-lowest shielding effectiveness value at a frequency of 250 MHz is for simulated PAN-20PANI-40HCSA; and the curve with the lowest shielding effectiveness value at a frequency of 250 MHz is for measured PAN-20PANI-40HCSA.

Figure 9:
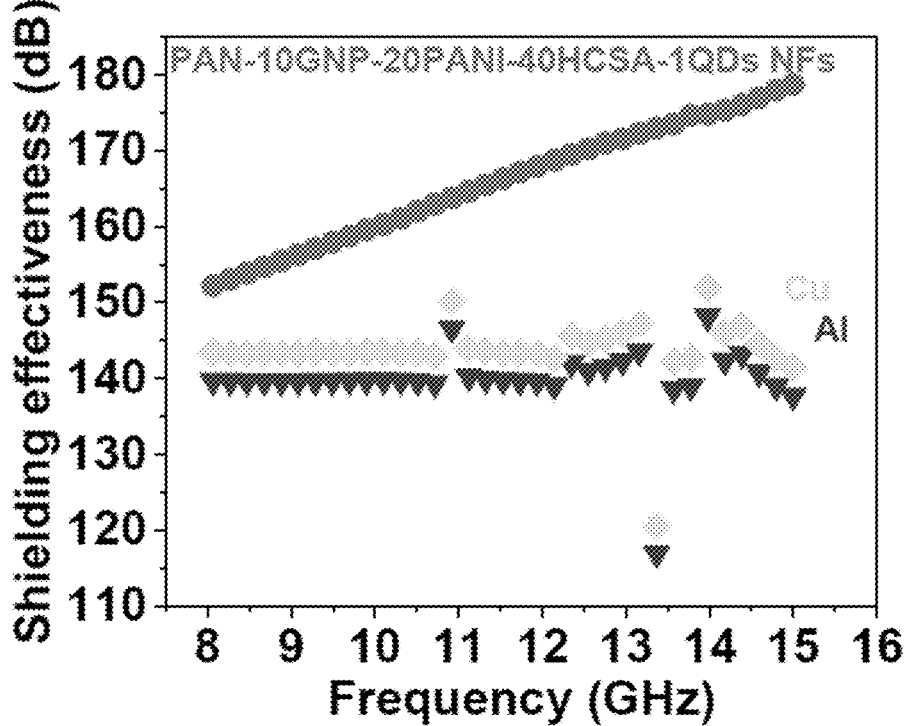

FIG. 9 shows a plot of simulated shielding effectiveness (in dB) versus frequency (in gigahertz (GHz)) for a PAN-10GNP-20PANI-40HCSA-1QDs fiber thin film, an aluminum film (thickness of 50 μm), and a copper film (thickness of 50 μm). The circular data points are for PAN-10GNP-20PANI-40HCSA-1QDs; the diamond-shaped data points are for copper; and the triangular data points are for aluminum.

Figure 10:
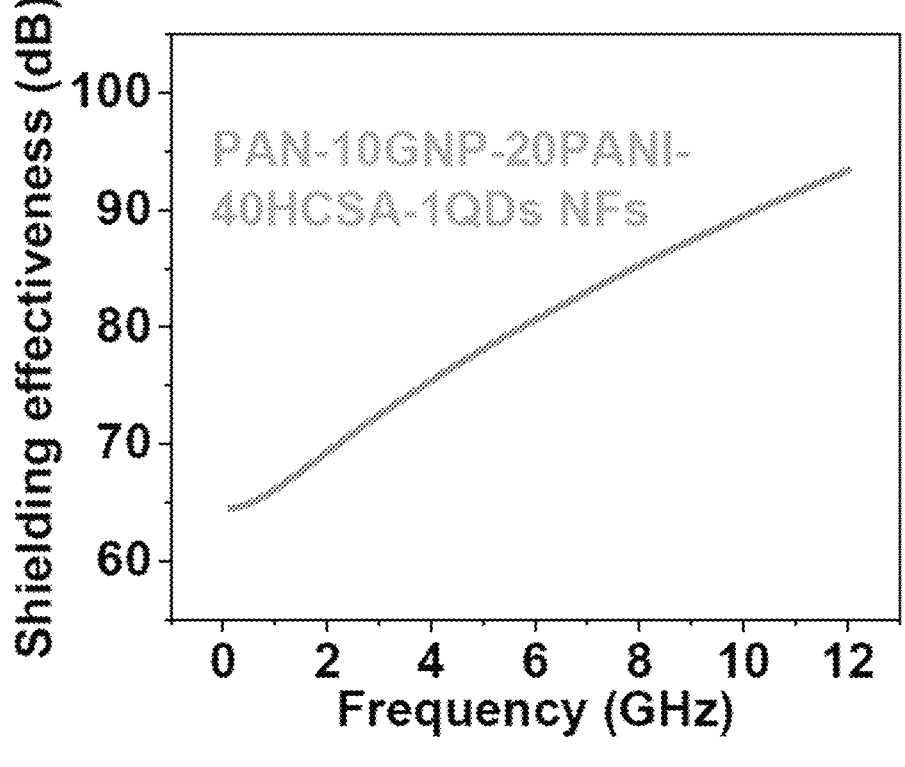

FIG. 10 shows a plot of simulated shielding effectiveness (in dB) versus frequency (in GHz) for a PAN-10GNP-20PANI-40HCSA-1QDs fiber thin film.

FIGS. 11A-11C show a table (broken into three parts in FIGS. 11A, 11B, and 11C, respectively) showing properties of different methods for electromagnetic interference (EMI) shielding. The column headers for the rows in FIGS. 11B and 11C are the same as those for 11A.

DETAILED DESCRIPTION

Embodiments of the subject invention provide novel and advantageous materials that can be used for electromagnetic interference (EMI) shielding, as well as methods of fabricating the same and methods of using the same. Polymer-based fiber thin films of embodiments can have superior electrical conductivity and excellent EMI shielding efficiency while being ultra-flexible and ultra-lightweight. The fiber thin films can be dual polymer thin films and can incorporate quantum dots (QDs) (e.g., magnetic quantum dots) (e.g., 1 wt. % of less of QDs) and/or two-dimensional (2D) conductive nanomaterials (e.g., 25 wt. % of less of 2D conductive nanomaterials) within a dual polymer matrix comprising a conductive polymer and a nonconductive polymer. The resultant composite thin film (e.g., thickness of 100 micrometers (μm) or less (e.g., 50 μm or less or about 50 μm) can have a density in a range of, for example, 2 grams per cubic centimeter (g/cm$^3$) or less (e.g., in a range of from 1 g/cm$^3$ to 1.2 g/cm$^3$, a porosity in a range of, for example, at least 60% (e.g., in a range of from 60% to 80%), and an electrical conductivity of, for example, at least 40,000 Siemens per meter (S/m) (e.g., at least 100,000 S/m, at least 150,000 S/m, at least 200,000 S/m, at least 250,000 S/m, at least 300,000 S/m, at least 350,000 S/m, at least 400,000 S/m, at least 500,000 S/m, or in a range of from 40,000 S/m to 600,000 S/m).

The outstanding electrical conductivity, coupled with a multilayer heterogeneity structure, endows the composites of embodiments of the subject invention with exceptional shielding effectiveness against low-frequency EMI waves (e.g., 0 megahertz (MHz) to 1 MHz), achieving up to 54 decibels (dB), which surpasses the shielding capability of aluminum and copper by 2.5 times for equivalent thicknesses. Further, the composites showcase remarkable shielding effectiveness in the high-frequency X Band (8 gigahertz (GHz) to 12 GHz) spectrum, reaching up to 170 dB, thereby exceeding the performance of aluminum and copper with similar thicknesses, which typically demonstrate shielding effectiveness in the range of about 140 dB to 150 dB.

In order to pursue ultra-flexibility, dispersing conductive fillers into a polymer matrix can be utilized. However, uniformly dispersing conductive fillers within non-conductive polymer composites while preserving good electrical conductivity and flexibility presents a significant challenge. Embodiments of the subject invention address this challenge, as well as those discussed in the Background section, by employing methodologies to synthesize materials with enhanced electrical conductivity, including a hybrid polymer system integrating QDs and/or 2D nanomaterials. The composite can be processed into fiber composites (e.g., through an electrospinning technique). Within these fiber composites, a fraction of the QDs/2D nanomaterials can align and arrange systematically along the radial axis of the ultra-long fibers. This alignment can create efficient and nearly perfect pathways for electron and phonon transmission. Additionally, some QDs/2D nanomaterials can be interspersed between the layers of fibers, which enhances conductive fillers overlapping, thereby forming effective conductive pathways. These interactions significantly augment electron percolation among the dispersed fillers within the conductive networks, thereby boosting the electrical conductivity of the composite while requiring a lower filler content. The lower filler content ensures the mechanical robustness of polymer composites with limited filler agglomeration.

Due to their high surface area and low fiber diameters (e.g., 2.5 μm or less, such as in a range of from 0.001 μm to 2.5 μm), the hybrid films can demonstrate an ultra-lightweight nature (e.g., density in a range of from 1 g/cm$^3$ to 1.2 g/cm$^3$) with a multilayer conductive network. The multilayered network can rely on internal reflection for the incident signal inside the EMI shield. More layers can lead to more reflection, which can cause more attenuation in the signal.

Importantly, composites of embodiments of the subject invention are resilient to repeated bending, indicating the composite's sustained reliability under mechanical deformation. The density of the composites is significantly lower (more than 2-fold and 7-fold, respectively) compared to aluminum (Al) and copper (Cu). This structural integrity is further evidenced by their high porosity (e.g., in a range of from 60% to 80%), featuring interconnected pore networks, which are instrumental in achieving enhanced permittivity and permeability. The large surface area and multilayered, connected porous structure of the networks of the composites can facilitate the entrance of EMI waves, promoting their reflection, scattering, and extended propagation within the networks. The internal hierarchical structures of the composites can facilitate changes in the wavelength and velocity of the EMI waves, reducing their energy. Graphene nanoplatelets (GNP), known for their high electrical conductivity, can induce conductive losses, particularly through electron transfer between disordered graphene layers, thereby absorbing more EMI energy.

Similarly, due to their natural resonance and enhanced permeability, QDs (e.g., magnetic QDs, such as magnetic iron oxide QDs) can contribute to hysteresis and eddy current losses. Further, the interfacial polarization between the QDs/2D nanomaterials and the polymer matrix can enhance the polarization loss of incident waves. A minor portion of EMI wave reflection can also occur on the surface of conductive materials, attributable to impedance mismatch and interactions with free electrons. Moreover, by varying the type of non-conductive polymers (e.g., polyacrylonitrile (PAN), poly(vinylidene fluoride) (PVDF), polystyrene (PS), polypropylene (PP), and polytetrafluorocthylene (PTFE)), the hydrophobicity of the composite films can be tuned to a range of, for example, from 90° to 140°. This adjustment can impart self-cleaning and waterproof properties to the composites, ensuring their long-term reliability in wet and high-humidity conditions.

Embodiments of the subject invention include dual polymer fiber thin films integrated with QDs and/or 2D nanomaterials, the thin films being ultra-flexible and ultra-light-weight while having high conductivity and high EMI shielding efficiency. Features of embodiments of the subject invention include the following.

QDs and/or 2D nanomaterials can be incorporated, including magnetic and conductive nanomaterials (e.g., iron oxide QDs, 2D GNP).

A dual polymer system can combine a conductive polymer, having x-conjugated electron systems, with a non-conductive polymer. By varying the type of non-conductive polymers (e.g., PVDF, PS, PP, PTFE), the hydrophobicity of the composite films can be tuned to a range of 90° to 140°. This adjustment can impart self-cleaning and waterproof properties to the composites, ensuring their long-term reliability in wet and high-humidity conditions.

The films can have uniform distribution and low concentrations of QDs (e.g., 1 wt. % or less) and 2D material (e.g., 25 wt. % or less) compared to the dual polymer content.

The films can have a self-assembled multilayer structure with no precursor or any bonding, coating, thermal, and/or chemical post-processing treatment(s).

Figure 1:
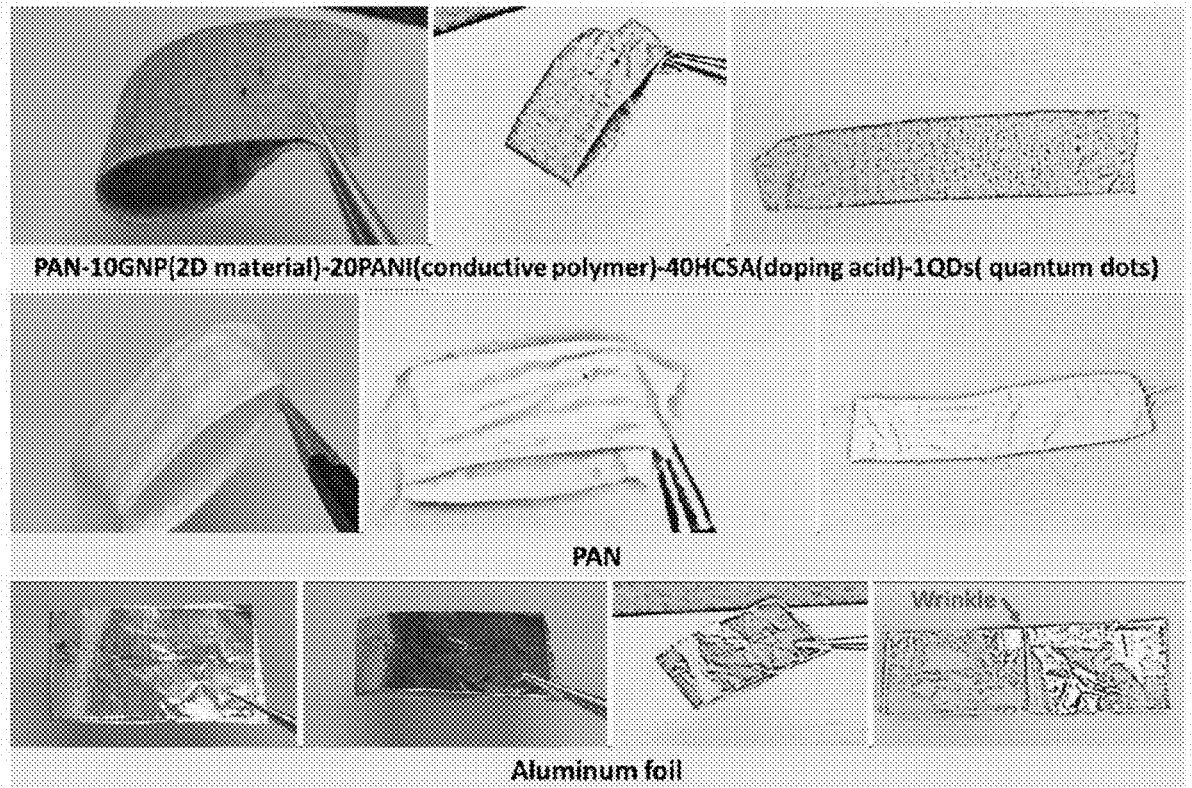
FIG. 1 shows images of pure polyacrylonitrile (PAN), of aluminum foil, and of fiber composites of PAN, polyaniline (PANI), quantum dots (QDs), and a two-dimensional (2D) material, illustrating the foldability of these materials.

The films can have a small thickness (e.g., less than 100 μm, such as about 50 μm) can be ultra-flexible, such that they can endure more than 1,000 instances of bending without breakage. The films can be ultra-lightweight with a density in a range of, for example, from 1 g/cm$^3$ to 1.2 g/cm$^3$, which is more than 2-fold and 7-fold lower compared to conventional EMI shielding metals (e.g., aluminum and copper, respectively). As depicted in FIG. 1, the aluminum foil exhibits noticeable wrinkling following pressure folding, whereas the fiber-based product of embodiments of the subject invention maintains a wrinkle-free structure.

The films can have high porosity (e.g., of at least 60%, such as in a range of from 60% to 80%), featuring interconnected pore networks, enhanced permittivity, and enhanced permeability.

The films can have high electrical conductivity (e.g., at least 40,000 S/m, such as in a range of from 40,000 S/m to 600,000 S/m) due to the conductive polymer having x-conjugated electron systems, a fraction of the QDs and/or 2D nanomaterials aligning and arranging systematically along the radial axis of the ultra-long fibers, and some QDs and/or 2D nanomaterials being interspersed between the layers of fibers, which can enhance the likelihood of conductive fillers overlapping.

The films can have excellent low-frequency EMI wave (e.g., 0 MHz to 1 MHz) shielding effectiveness (e.g., at least 30 dB, such as in a range of from 30 dB to 54 dB), such as a 2.5-fold increase over aluminum and copper of the same thickness (e.g., 50 μm) (i.e., 54 dB is 2.5-fold higher than that of aluminum and copper with the same thickness).

The films can have excellent high-frequency X Band (8 GHz to 12 GHz) shielding effectiveness (e.g., at least 30 dB, such as in a range of from 30 dB to 170 dB), higher than aluminum and copper of the same thickness (e.g., 50 μm; about 140 dB to 150 dB for Al and Cu).

The predominant EMI shielding mechanisms can be absorption and multi-reflection, which minimizes secondary EMI pollution and limits interference with other electronic devices due to a weaker reflection mechanism.

Applications of the composite films can include wearable, portable, and/or flexible electronic skins or sensors, wireless telecommunication (e.g., 5G technology), aircraft or spacecraft electronics, military stealth technology, and medical devices.

In an embodiment, a method for fabricating a polymer-based fiber thin film can comprise preparing an electrospinning solution, performing electrospinning using the electrospinning solution, and forming a thin film on a substrate via the electrospinning.

The preparation of the electrospinning solution can comprise dissolving a first polymer (e.g., a non-conductive polymer, such as PAN and/or PVDF) in an organic solvent (e.g., dimethylformamide (DMF) and/or chloroform), and this can be done to achieve magnetic dispersion, continuing until a homogeneous solution is formed. Then a second polymer (e.g., a conductive polymer, such as polyaniline (PANI)) can be introduced into the solution, followed by magnetic dispersion for a predetermined amount of time (e.g., at least 1 hour, such as at least 12 hours). This process can ensure that the conductive and non-conductive polymer chains are intricately intertwined and conjugated. Following this, a doping acid (e.g., (1S)-(+)-10-camphorsulfonic acid (HCSA)) can be added to the mixture. The solution can then undergo magnetic dispersion for an additional predetermined amount of time (e.g., at least 0.5 hours, such as at least 3 hours), which can guarantee a uniform distribution of the doping acid within the dual polymer matrix. Then, 2D materials (e.g., GNP), which may constitute up to 25 wt. % of the dual polymer amount, can be incorporated into the solution. This can be followed by magnetic dispersion for an additional predetermined amount of time (e.g., at least 1 hour, such as at least 24 hours) and ultrasonication for a predetermined amount of time (e.g., at least 0.5 hours, such as at least 3 hours), which can ensure thorough integration. Next, QD materials can be added, and the QDs can amount to no more than 1 wt. % of the dual polymer quantity. The solution can then be subjected to magnetic dispersion for an additional predetermined amount of time (e.g., at least 1 hour, such as at least 24 hours) and ultrasonication for an additional predetermined amount of time (e.g., at least 0.5 hours, such as at least 3 hours). The solution can then remain under continuous magnetic dispersion until the electrospinning process is started.

The prepared composition solution (as discussed in the previous paragraph) can be electrospun at predetermined voltage (e.g., in a range of from 10 kilovolts (kV) to 30 kV), a predetermined pumping speed (e.g., in a range of from 0.1 milliliters per hour (ml/h) to 2 ml/h), and a predetermined collector rotating speed (e.g., in a range of from 500 revolutions per minute (rpm) to 1500 rpm). A thin film (e.g., thickness of 100 μm or less, such as about 50 μm) can be deposited onto a substrate, such as a substrate that lacks EMI shielding properties (e.g., a (thin) paper substrate). If EMI shielding effectiveness is to be evaluated, the thin film can have a predetermined minimum length (e.g., at least 1 inch, such as at least 6 inches) and width (e.g., at least 1 inch, such as at least 3 inches).

The engineered QDs/2D dual polymer fiber thin films of embodiments of the subject invention are advantageous for many diverse engineering applications. The excellent shielding properties and flexibility of the films make it easier to implement the films as a shield at the printed circuit board (PCB) or package level, or even at the component level. Specifically, the films can greatly benefit the electronics, automotive, medical devices, military, telecommunications, and aerospace sectors. Applications include but are not necessarily limited to: electronics (e.g., sensitive components in flexible and foldable smartphones, smartwatches, fitness trackers, tablets, and laptops); aerospace (e.g., protection for electronic elements involved in aerospace navigation, communication, and operational systems), automotive (protection for electronic elements involved in engine, braking, and infotainment systems in autonomous, electric, and hybrid vehicles), military defense (e.g., defense for radar and navigational technologies in military hardware); medical devices (e.g., magnetic resonance imaging (MRI) equipment, pacemakers, and diagnostic/therapeutic devices); telecommunications (e.g., base stations and routers); data centers (e.g., servers and data storage devices); shielding fabrics (e.g., protective clothing and tents); and microwave applications in radio frequency (RF) circuits, radar, and Internet of Things (IoT).

Challenges in related art shielding technology include: how to improve the effectiveness of performance in the broadband frequency range; how to miniaturize the electronic components, as thinner EMI shielding is needed; and how to fabricate EMI shielding (particularly, the related art does not mention fabrication of multilayered EMI shielding). Embodiments of the subject invention provide novel materials that have excellent EMI shielding properties at low frequencies (e.g., down to 1 kilohertz (kHz) or lower) and at high frequencies (e.g., 12 GHZ). In addition, the shielding properties of the materials are superior compared to traditional materials such as Cu and Al. In addition, the materials can be self-layered, subsequently reducing the complexity of the multilayered fabrication. Meanwhile, the materials are very flexible and can be implemented easily in any electronic system with less weight and contourable thickness.

Further, the related art include no teaching of applying QDs/2D dual polymer fiber thin films for EMI shielding. The table in FIGS. 11A-11C presents a comparative analysis, including select patents and other related art methods/materials. The manufacturing of lightweight EMI shielding materials can be classified into five primary methodologies. "Method 1" (as listed in FIGS. 11A-11C) involves the utilization of a pure electrospinning technique. "Method 2" (as listed in FIGS. 11A-11C) includes creating composite materials through various processes, including stacking, plastic processing techniques, wrapping/woven methods, polymer blending with subsequent curing, and compression molding. "Method 3" (as listed in FIGS. 11A-11C) pertains to the post-processing deposition of metallic particles onto the surfaces of fibers or fabrics, which can be achieved through techniques such as electroless plating/electrolysis and chemical seeding/deposition. "Method 4" (as listed in FIGS. 11A-11C) involves coating facilitated by vacuum-assisted filtration. "Method 5" (as listed in FIGS. 11A-11C) relates to foam fabrication, employing the template sacrifice approach and in situ growth processes. Advantages and novelties of embodiments of the subject invention compared to the related art methods/materials in the table in FIGS. 11A-11C are discussed in more detail below.

With respect to Method 1, embodiments of the subject invention can utilize up to 25 wt. % of conductive materials compared to 82 wt. % in the related art. Meanwhile, the thickness of the film can be 2.5-fold thinner, with 12.5% better EMI shielding effectiveness for 8 GHz to 12 GHZ wavelengths. Embodiments of the subject invention also maintain excellent EMI shielding performance in the range of 0 MHz to 1 MHz and the range of 0.16 GHz to 12 GHZ.

With respect to Method 3, while post-processing metal deposition techniques can increase the surface electrical conductivity, the resultant EMI shielding effectiveness of the products typically falls within the range of 53 dB to 95 dB for frequencies spanning from 8 GHz to 12 GHz. This observed performance level is primarily attributed to several inherent limitations of the metal deposition process. First, achieving a uniform metal coating over the substrate surface presents a significant challenge, leading to inconsistencies in shielding effectiveness. Second, the penetration depth of the metal particles within the substrate is often limited, resulting in insufficient shielding depth and effectiveness. Last, the adhesion strength of the metal particles to the substrate surface tends to be suboptimal, which raises concerns regarding the long-term durability and reliability of the EMI shielding under various environmental and operational conditions.

With respect to Method 4, similar to Method 3, products manufactured through a coating process facilitated by vacuum-assisted filtration generally exhibit EMI shielding effectiveness within the range of 79.8 dB to 85 dB, specifically for the 8 GHz to 12 GHz frequency band. Compared with embodiments of the subject invention, this comparatively lower level of EMI shielding effectiveness can be attributed to several key factors inherent in the vacuum-assisted filtration process. First, attaining a uniform coating presents a significant challenge, leading to inconsistencies in shielding effectiveness. Second, precise control over the coating thickness using vacuum-assisted filtration is difficult to achieve, which is crucial for optimal shielding. Third, not all materials are compatible with vacuum-assisted filtration, limiting the range of suitable substrates for effective coating. Last, the process may also result in coatings that limit the bending flexibility of the final product, which is an important attribute for certain applications.

With respect to Method 5, embodiments of the subject invention (with a thickness of, for example, about 50 μm) can be substantially thinner (such as about 100 times thinner) than the foam generated through Method 5. With a composition inclusive of 10% GNP and 1% QDs, materials of embodiments of the subject invention can have an electrical conductivity of about 857 times greater than that of the polymer/silver foam containing 30% to 50% silver. Embodiments of the subject invention can further be twice as effective at EMI shielding effectiveness within the 8 GHz to 12 GHz frequency range compared to the performance of the polymer/silver foam.

There is an urgent need for lightweight, flexible, and efficient EMI shielding materials. Currently, no products on the market satisfactorily address the challenges posed by the increased electronics exposure in contemporary society. Embodiments of the subject invention provide materials (and methods of fabricating and using the same) that are ultra-lightweight and ultra-flexible, with high electrical conductivity and excellent EMI shielding effectiveness against low- and high-frequency interferences. The materials are based on a unique integration of QDs and/or 2D materials in a dual polymer fiber mat (or matrix) that can be used for EMI shielding applications. The products have a shielding effectiveness three times more than commercial materials such as Cu and Al at the same thickness. In addition, the incorporation of graphene (e.g., GNP) can enhance the thermal performance of the material/shield, leading to a decrease in thermal resistance, which can increase the power limits of the application. The materials also have outstanding performance in EMI shielding in the X-band and at intermediate frequencies, meaning they can be implemented in power electronic applications such as switch mode power supply (SMPS), transformers, inductors, and any magnetic circuit. Embodiments of the subject invention also have simplicity, speed, cost-effectiveness, and repeatability.

The materials of embodiments of the subject invention can be easily scaled up from laboratory to industry, which creates a huge market for EMI shielding applications. The scalability can be realized by, for example, applying the current fabrication methods in industry-level electrospinning equipment (for example, Elmarco and/or Inovenso). EMI shielding is critical in power applications such as shielding between the primary and secondary winding for power transforms. The materials can also be implemented in other components, such as power inductors and switching elements. Shielding is also integrated at the enclosure level, especially the power module, such as in a direct current (DC)-DC converter. Additionally, the versatility of the materials of embodiments of the subject invention enable applications across a broad spectrum of fields, including sensor technology, catalytic processes, fuel cell development, photodetector systems, transistor technology, biosensing, bioimaging, battery and supercapacitor innovation, solar cell enhancements, flexible circuitry, wearable technology, smart textiles, quantum computing, and advanced computing solutions.

When ranges are used herein, combinations and subcombinations of ranges (including any value or subrange contained therein) are intended to be explicitly included. When the term "about" is used herein, in conjunction with a numerical value, it is understood that the value can be in a range of 95% of the value to 105% of the value, i.e. the value can be +/−5% of the stated value. For example, "about 1 kg" means from 0.95 kg to 1.05 kg.

A greater understanding of the embodiments of the subject invention and of their many advantages may be had from the following examples, given by way of illustration. The following examples are illustrative of some of the methods, applications, embodiments, and variants of the present invention. They are, of course, not to be considered as limiting the invention. Numerous changes and modifications can be made with respect to embodiments of the invention.

Materials and Methods

A non-conductive polymer (e.g., PAN and/or PVDF) was dissolved in an organic solvent (e.g., DMF and/or chloroform) to achieve magnetic dispersion, continuing until a homogeneous solution was formed. Subsequently, a conductive polymer (e.g., PANI) was introduced into this solution, followed by magnetic dispersion for at least 12 hours. This process ensured that the conductive and non-conductive polymer chains were intricately intertwined and conjugated. Following this, a doping acid (e.g., HCSA) was added to the mixture. The solution then underwent an additional 3 hours of magnetic dispersion to obtain a uniform (or near-uniform) distribution of the doping acid within the dual polymer matrix. Then, 2D materials (e.g., GNP) (if present in the final material), constituting up to 25 wt. % of the dual polymer amount, were incorporated into the solution. This was succeeded by 24 hours of magnetic dispersion and 3 hours of ultrasonication to ensure thorough integration. Then, QDs materials (if present in the final material) were added, amounting to no more than 1 wt. % of the dual polymer quantity. The solution was then subjected to another 24 hours of magnetic dispersion and 3 hours of ultrasonication. After that, the solution remained under continuous magnetic dispersion until the electrospinning process was started.

The prepared composition solution was electrospun at a 10 kV to 30 kV voltage, pumping speed of 0.1 ml/to 2 ml/h, and a collector rotating speed of 500 rpm to 1500 rpm. Thin films were deposited onto a thin paper substrate lacking EMI shielding properties. Thin film samples were prepared with dimensions of at least 3 inches (width) by 6 inches (length) (and a thickness of about 50 μm) such that EMI shielding effectiveness could be evaluated.

Example 1

Figure 3C:
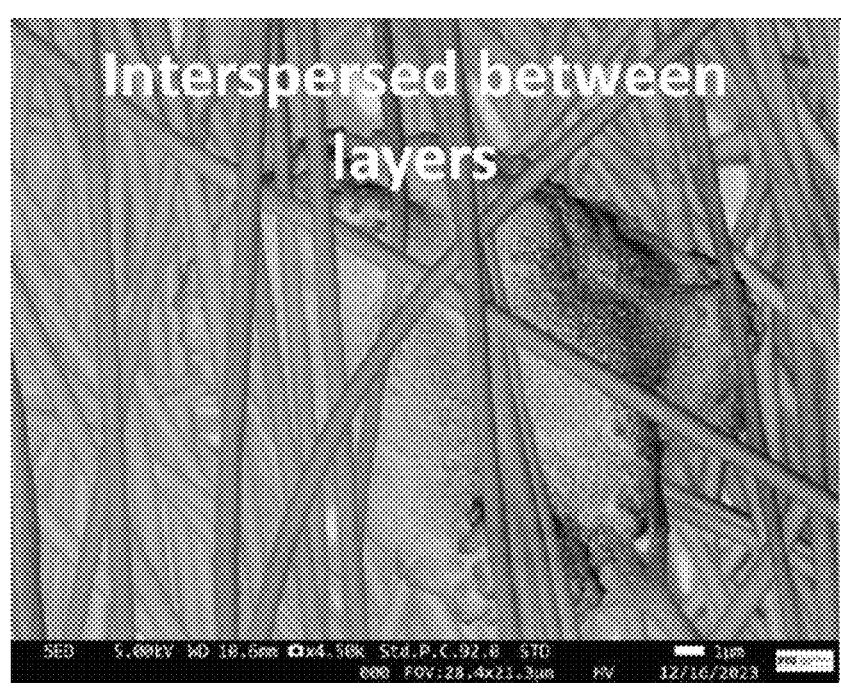
FIG. 3C shows an SEM image of QDs and 2D nanoma-terials incorporated within a multilayer fiber matrix, in which the nanomaterials are interspersed between layers. The scale bar is 1 μm.

Compared to pure PAN fiber, fibers of QDs/2D composite films had a significant increase in surface roughness (see FIGS. 2A and 2B) because of the incorporation of the QDs/2D nanomaterials along the radial axis of the ultra-long fibers. FIGS. 3A-3C show QDs/2D nanomaterials incorporated statues within the multilayer fiber matrix; FIGS. 3A and 3B show incorporation along the fiber, and FIG. 3C shows incorporation by being interspersed between the layers of fibers.

Example 2

Figures 4A, 4B:
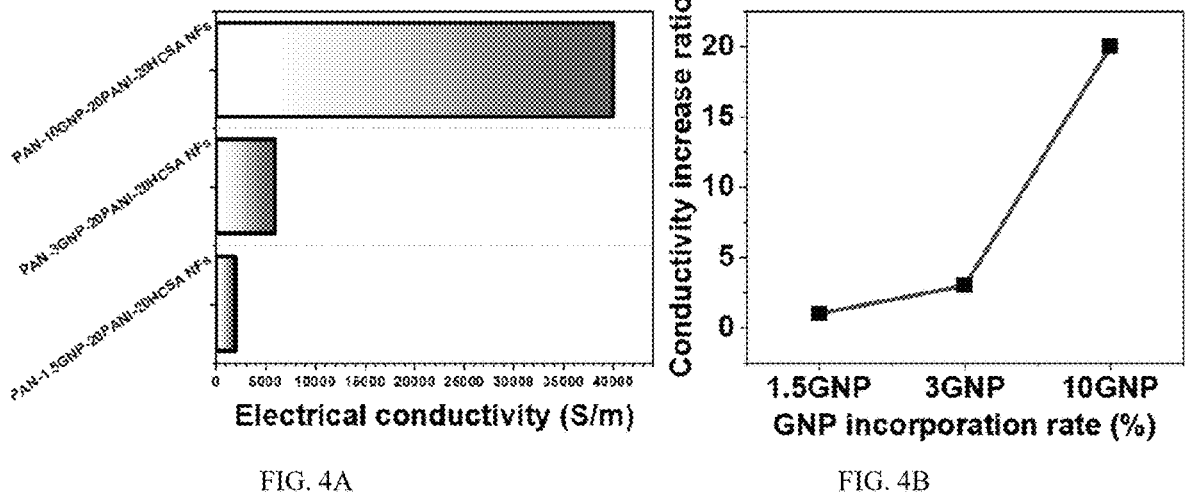
FIG. 4A shows a bar chart of electrical conductivity (in Siemens per meter (S/m)) for fiber thin films with graphene nanoplatelets (GNP) at varying weight percentage (wt. %). Each fiber thin film is PAN (as a nonconductive polymer) with 20 wt. % PANI (as a conductive polymer), 20 wt. % camphorsulfonic acid (HCSA) (as a doping agent), and GNP. The top bar, the middle bar, and the bottom bar are for 10 wt. % GNP, 3 wt. % GNP, and 1.5 wt. % GNP, respectively, in the PAN-PANI-HSCA fiber thin film.
FIG. 4B shows a plot of conductivity increase ratio versus GNP incorporation rate (in %) for GNP incorporated into the fiber thin films discussed for FIG. 4A.
Figure 5:
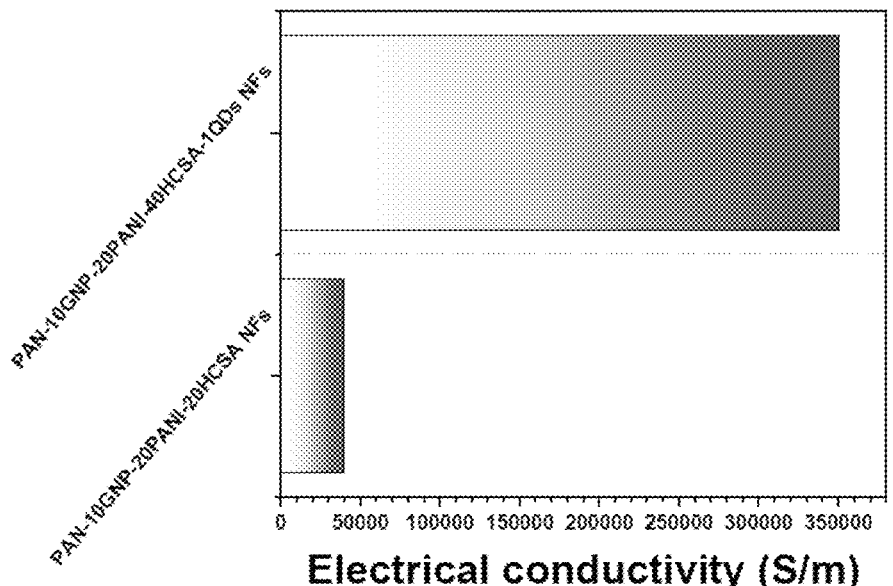
FIG. 5 shows a bar chart of electrical conductivity (in S/m) for fiber thin films. The top bar is for PAN (as a nonconductive polymer) with 10 wt. % GNP (as a 2D material), 20 wt. % PANI (as a conductive polymer), 40 wt. % HCSA (as a doping acid), and 1 wt. % QDs; and the bottom bar is for PAN (as a nonconductive polymer) with 10 wt. % GNP (as a 2D material), 20 wt. % PANI (as a conductive polymer), and 20 wt. % HCSA (as a doping acid).

The film's electrical conductivity was assessed using the four-point probe method. As shown in FIGS. 4A and 4B, while keeping the non-conductive polymer, conductive polymer, and doping acid at a constant 1:0.2:0.2 ratio, the increase of 10 wt. % GNP significantly (20-fold) enhanced the electrical conductivity of the thin film compared to the sample with 1.5 wt. % GNP. FIG. 5 shows that the electrical conductivity of PAN (nonconductive polymer)-10GNP (2D material)-20PANI (conductive polymer)-40HCSA (doping acid)-1QDs (quantum dots material) was more than 8-fold higher than that of PAN (nonconductive polymer)-10GNP (2D material)-20PANI (conductive polymer)-20HCSA (doping acid) films, meaning that the inclusion of QDs (even at 1 wt. %) leads to a significant increase in electrical conductivity.

Example 3

Figure 6A:
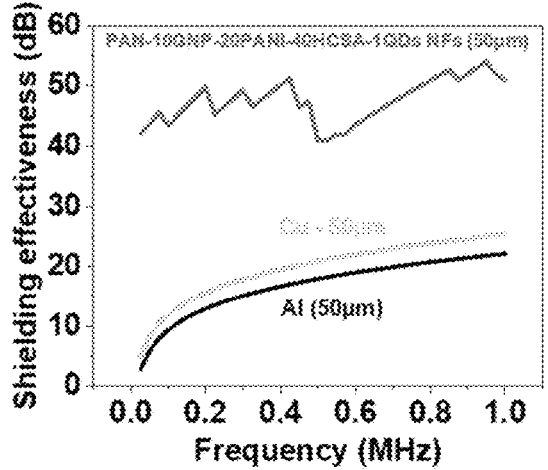
FIG. 6A shows a plot of shielding effectiveness (in decibels (dB)) versus frequency (in megahertz (MHz)) for copper (thickness of 50 μm), aluminum (thickness of 50 μm), and a fiber thin film of PAN (as a nonconductive polymer) with 10 wt. % GNP (as a 2D material), 20 wt. % PANI (as a conductive polymer), 40 wt. % HCSA (as a doping acid), and 1 wt. % QDs.
Figure 6B:
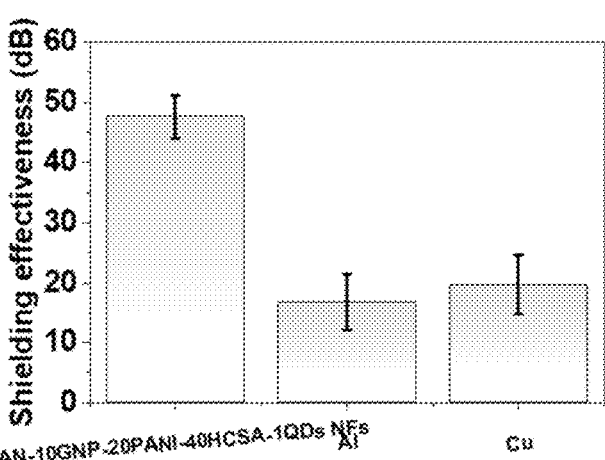
FIG. 6B shows a bar chart of shielding effectiveness (in dB) for the materials discussed for FIG. 6A. The left bar is for the fiber thin film; the middle bar is for aluminum; and the right bar is for copper.

The EMI shielding effectiveness at frequencies in a range of from 0 MHz to 1 MHz was assessed for PAN (nonconductive polymer)-10GNP (2D material)-20PANI (conductive polymer)-40HCSA (doping acid)-1QDs (quantum dots material), and it was as high as 47 dB, which is about 2.5-fold higher than that of Al and Cu of the same thickness (50 μm), as shown in FIGS. 6A and 6B.

Example 4

Figure 7:
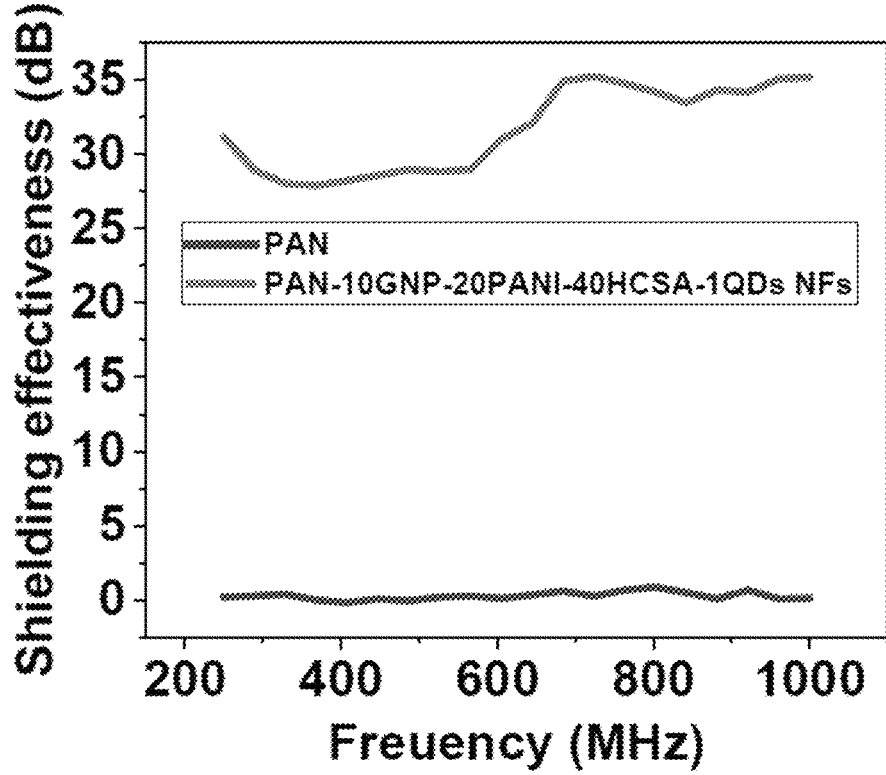
FIG. 7 shows a plot of shielding effectiveness (in dB) versus frequency (in MHz) for a PAN film (thickness of 50 μm) and a fiber thin film of PAN (as a nonconductive polymer) with wt. % GNP (as a 2D material), 20 wt. % PANI (as a conductive polymer), 40 wt. % HCSA (as a doping acid), and 1 wt. % QDs. The curve with the higher shielding effectiveness values across all shown frequencies is for the PAN-10GNP-20PANI-40HCSA-1QDs film.

The EMI shielding effectiveness at frequencies in a range of from 250 MHz to 1000 MHz was assessed. The shielding properties were measured using a vector network analyzer (VNA), two magnetic sources, four-point probes, and a power spectrum analyzer. The shielding effectiveness of PAN (non-conductive polymer)-10GNP (2D material)-20PANI (conductive polymer)-40HCSA (doping acid)-1QDs (quantum dots material) was about 35 dB, which is 70-fold higher than for pure PAN films, as shown in FIG. 7.

Using the computational modeling method, the simulated EMI shielding effectiveness demonstrated high accuracy with the simulation, with correlation higher than 90% for samples of PAN (non-conductive polymer)-1.5GNP (2D material)-20PANI (conductive polymer)-20HCSA (doping acid), PAN (non-conductive polymer)-3GNP (2D material)-20PANI (conductive polymer)-20HCSA (doping acid), PAN (non-conductive polymer)-10GNP (2D material)-20PANI (conductive polymer)-20HCSA (doping acid), PAN (non-conductive polymer)-20PANI (conductive polymer)-40HCSA (doping acid), and Al, as shown in FIGS. 8A and 8B.

Example 5

Simulated EMI shielding effectiveness at frequencies in a range of from 8 GHz to 12 GHz was assessed. Based on measured electrical conductivity, the EMI shielding effectiveness was simulated for PAN (non-conductive polymer)-10GNP (2D material)-20PANI (conductive polymer)-40HCSA (doping acid)-1QDs (quantum dots material) fiber films, Al, and Cu. As shown in FIG. 9, materials of embodiments of the subject invention demonstrated shielding effectiveness as high as 170 dB compared to about 140 dB to 150 dB for Al and Cu. Based on measured electrical conductivity, the EMI shielding effectiveness was simulated for PAN (non-conductive polymer)-10GNP (2D material)-20PANI (conductive polymer)-40HCSA (doping acid)-1QDs (quantum dots material) fiber films. As shown in FIG. 10, materials of embodiments of the subject invention demonstrated shielding effectiveness up to about 93 dB (e.g., in a range of from 64 dB to 93 dB).

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A polymer-based thin film, comprising:
a multilayer fiber matrix comprising a first polymer and a second polymer different from the first polymer; and
nanomaterials incorporated within the multilayer fiber matrix,
the nanomaterials comprising quantum dots (QDs) and two-dimensional (2D) conducive nanomaterials,
the polymer-based thin film having a thickness of no more than 100 micrometers (μm),
the first polymer being a nonconductive polymer and the second polymer being a conductive polymer,
the polymer-based thin film having an electrical conductivity of at least 300,000 Siemens per meter (S/m),
the polymer-based thin film having a porosity in a range of from 60% to 80%,
the QDs being present in the polymer-based thin film in an amount of no more than 1 wt. %,
the 2D conducive nanomaterials being present in the polymer-based thin film in an amount of no more than 25 wt. %,
the QDs being magnetic QDs,
the nanomaterials being incorporated along a radial axis of fibers of the multilayer fiber matrix, and
the nanomaterials being incorporated by being interspersed between layers of the multilayer fiber matrix.

2. An electromagnetic interference (EMI) shield, comprising:
a substrate; and
the polymer-based thin film according to claim 1 disposed on the substrate,
the EMI shield having an EMI shielding effectiveness of at least 30 decibels (dB) at all frequencies in a range of from 1 kilohertz (kHz) to 1 megahertz (MHz) and an EMI shielding effectiveness of at least 160 dB at all frequencies in a range of from 8 gigahertz (GHz) to 12 GHz.

3. The polymer-based thin film according to claim 1, the 2D conducive nanomaterials being graphene nanoplatelets.

4. An electromagnetic interference (EMI) shield, comprising:
a substrate; and
the polymer-based thin film according to claim 3 disposed on the substrate,
the EMI shield having an EMI shielding effectiveness of at least 30 decibels (dB) at all frequencies in a range of from 1 kilohertz (kHz) to 1 megahertz (MHz) and an EMI shielding effectiveness of at least 160 dB at all frequencies in a range of from 8 gigahertz (GHz) to 12 GHz.

* * * * *